(12) United States Patent
Lim et al.

(10) Patent No.: US 8,144,539 B2
(45) Date of Patent: Mar. 27, 2012

(54) SEMICONDUCTOR MEMORY DEVICE FOR SELF REFRESH AND MEMORY SYSTEM HAVING THE SAME

(75) Inventors: Jong Hyoung Lim, Hwasung-si (KR); Sang Seok Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 158 days.

(21) Appl. No.: 12/645,962

(22) Filed: Dec. 23, 2009

(65) Prior Publication Data

US 2010/0165773 A1  Jul. 1, 2010

(51) Int. Cl.
 *G11C 7/00* (2006.01)
(52) U.S. Cl. ....................................... 365/222
(58) Field of Classification Search ............ 365/222
 See application file for complete search history.

(56) References Cited

U.S. PATENT DOCUMENTS 7,113,439 B2 * 9/2006 Fang et al. .................. 365/222
7,307,906 B2 * 12/2007 Kajigaya ..................... 365/207
7,355,918 B2   4/2008 Tahara

FOREIGN PATENT DOCUMENTS

KR    2005-104253    11/2005
* cited by examiner

*Primary Examiner* — Hoai V Ho
*Assistant Examiner* — Anthan Tran
(74) *Attorney, Agent, or Firm* — Stanzione & Kim, LLP

(57) ABSTRACT

A semiconductor memory device includes a memory core unit including a memory cell array including a plurality of memory cells and a sense amplifier to sense and amplify data of the plurality of memory cells, and a self refresh control unit to apply at least one first core voltage to the memory core unit and to control a self refresh operation to be performed at every first self refresh cycle, in a first self refresh mode, and to apply at least one second core voltage to the memory core unit and to control the self refresh operation to be performed at every second self refresh cycle, in a second self refresh mode. In the semiconductor memory, a level of the at least one first core voltage is higher than that of a corresponding one of the at least one second core voltage, and the first self refresh cycle is shorter than the second self refresh cycle.

10 Claims, 7 Drawing Sheets

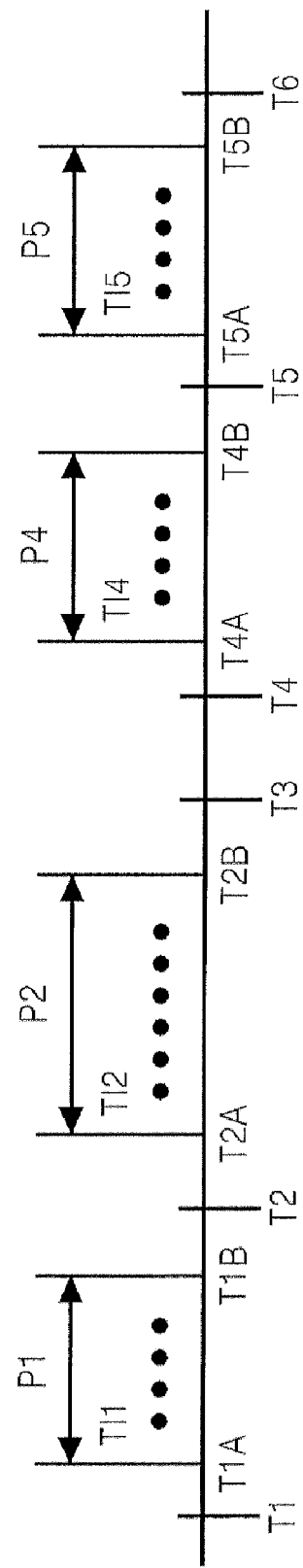

US 8,144,539 B2

SEMICONDUCTOR MEMORY DEVICE FOR SELF REFRESH AND MEMORY SYSTEM HAVING THE SAME

CROSS-REFERENCE TO RELATED APPLICATIONS

This application claims priority under 35 U.S.C. §119 of Korean Patent Application No. 10-2008-0134019, filed on 26 Dec. 2008, in the Korean Intellectual Property Office, the disclosure of which is incorporated herein in its entirety by reference.

BACKGROUND

1. Field of the Invention

The inventive concept relates to a semiconductor memory device, and more particularly, to a device to improve data restoration capability in a volatile semiconductor device such as a dynamic random access memory (DRAM).

2. Description of the Related Art

Semiconductor memory devices include volatile semiconductor memory devices and non-volatile semiconductor memory devices. The volatile semiconductor memory device exhibits fast read and write speeds but the stored contents are lost when an external power supply is discontinued. That is, for a memory cell for storing data in the volatile semiconductor memory device, the stored data is not maintained over a predetermined time because of its intrinsic leakage current. To compensate for the limit, a system regularly performs a refresh operation so that a memory device may restore data.

The refresh operation is a series of operations of amplifying the data stored in the memory cell by using a sense amplifier and then storing the data in the memory cell again. The refresh operation includes an auto refresh mode in which the refresh operation is performed during a normal operation and a self refresh mode in which the refresh operation is performed when the system does not operate for a long time, for example, in a ready mode or a low power consumption mode. In the self refresh mode, the refresh operation is continuously performed at a certain interval without any external command.

In general DRAMs, the refresh operation of a memory device is constantly performed according to a refresh signal having a predetermined cycle. Thus, when the refresh cycle is slow, data may be lost. When the refresh cycle is excessively fast, the consumption of power increases.

When, during a data write operation, a sufficient amount of charges is not stored in the memory cell due to insufficient data write time or insufficient voltage, the memory cell may become a weak cell that is highly likely to lose data. When the weak cell exists and further the refresh cycle is slow, data loss possibility may increase accordingly.

SUMMARY

The inventive concept provides a semiconductor memory device which may firmly restore data of a weak cell by the self refresh operation, and a memory system having the semiconductor memory device.

Additional aspects and utilities of the present general inventive concept will be set forth in part in the description which follows and, in part, will be obvious from the description, or may be learned by practice of the general inventive concept.

The foregoing and other aspects and utilities of the present general inventive concept may be achieved by providing a semiconductor memory device including a memory core unit having a memory cell array including a plurality of memory cells and a sense amplifier to sense and amplify data of the plurality of memory cells, and a self refresh control unit to apply at least one first core voltage to the memory core unit and to control a self refresh operation to be performed at every first self refresh cycle, in a first self refresh mode, and to apply at least one second core voltage to the memory core unit and to control the self refresh operation to be performed at every second self refresh cycle, in a second self refresh mode, in which a level of the at least one first core voltage is higher than that of a corresponding one of the at least one second core voltage, and the first self refresh cycle is shorter than the second self refresh cycle.

The self refresh control unit may operate in the first self refresh mode in response to a self refresh entry command, and in the second self refresh mode after refreshing each of a plurality of word lines subject to refresh only once in the first self refresh mode.

The self refresh control unit may include a timer generating a word line enable signal and a clock signal at every first self refresh cycle based on a self refresh entry command, an address counter sequentially generating a plurality of row addresses to designate the plurality of word lines subject to self refresh in response to the clock signal, and a core voltage generator generating the core voltage of a first level based on the self refresh entry command.

The foregoing and other aspects and utilities of the present general inventive concept may also be achieved by a semiconductor memory device including a memory cell array including a plurality of memory cells to store data and to perform data read or write operations according to correspond commands, and a self refresh control unit to generate one or more first core voltages at a first rate in a first refresh period in a first refresh mode and one or more second core voltages at a second rate in a second refresh period in a second refresh mode, to control the memory cell array to perform a refresh operation between the commands.

The first core voltages may be higher than the second core voltages. The first rate may be faster than the second rate. The first period may be longer than the second period.

The number of the first core voltages generated in the first refresh period may be the same number of the second core voltages generated in the second refresh period.

The self refresh control unit may generate the corresponding commands to the memory cell array to perform the data read and write operation, sequentially receive a self refresh start command and a self refresh end command, and sequentially generate a group of the first core voltages and a group of the second core voltages between the self refresh start command and the self refresh end command.

The corresponding commands may include a write command and a read command which are sequentially received from an outside of the device.

The first core voltages may be variable according to at least one of the first rate and the first period of the first refresh mode.

The second core voltages may be variable according to at least one of the second rate and the second period of the second refresh mode.

A ratio of the first voltages and the second core voltages may be determined according to at least one of a ratio of the first and second rates and a ratio of the first and second periods.

The foregoing and other aspects and utilities of the present general inventive concept may also be achieved by an apparatus including a semiconductor memory device comprising:

a memory cell array including a plurality of memory cells to store data, and a self refresh control unit to control the memory cell array to perform a refresh operation, and to generate a first core voltage at a first refresh cycle in a first self refresh mode and a second core voltage at a second refresh cycle in a second self refresh mode in the refresh operation, and a controller to generate a control signal to control the self refresh control unit of the semiconductor memory device to perform the refresh operation.

BRIEF DESCRIPTION OF THE DRAWINGS

Exemplary embodiments of the present general inventive concept will be more clearly understood from the following detailed description taken in conjunction with the accompanying drawings in which:

The above and/or other aspects of the present general inventive concept will become apparent and more readily appreciated from the following description of the exemplary embodiments, taken in conjunction with the accompanying drawings, in which:

FIG. 4B illustrates self refresh mode operations of a semiconductor memory device according to an exemplary embodiment of the present inventive concept;

DETAILED DESCRIPTION OF THE EMBODIMENTS

Figure 1:
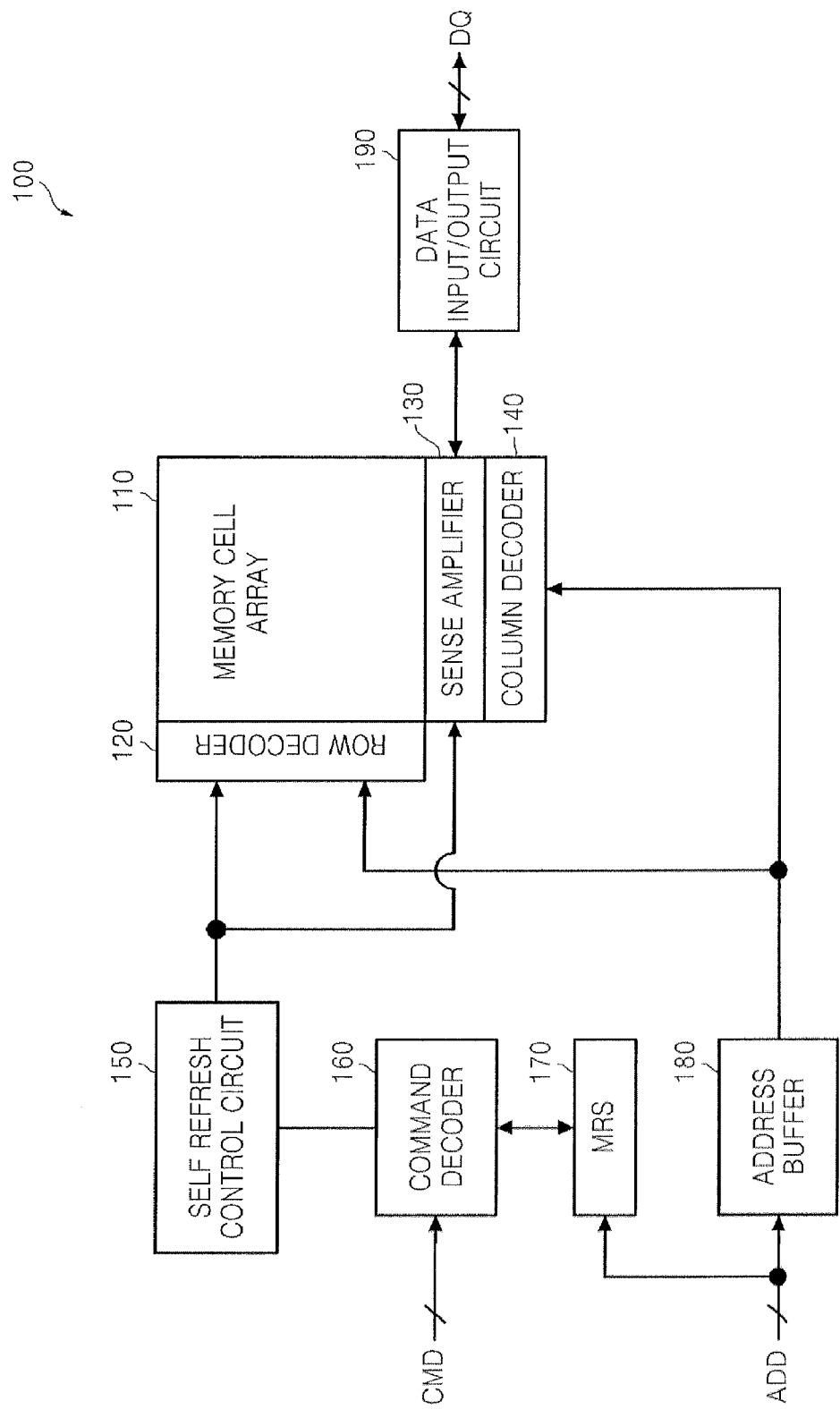
FIG. 1 is a block diagram of a semiconductor memory device according to an exemplary embodiment of the present inventive concept.

The attached drawings for illustrating embodiments of the inventive concept are referred to in order to gain a sufficient understanding of the inventive concept and the merits thereof. Hereinafter, the inventive concept will be described in detail by explaining embodiments of the inventive concept with reference to the attached drawings. Like reference numerals in the drawings denote like elements.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
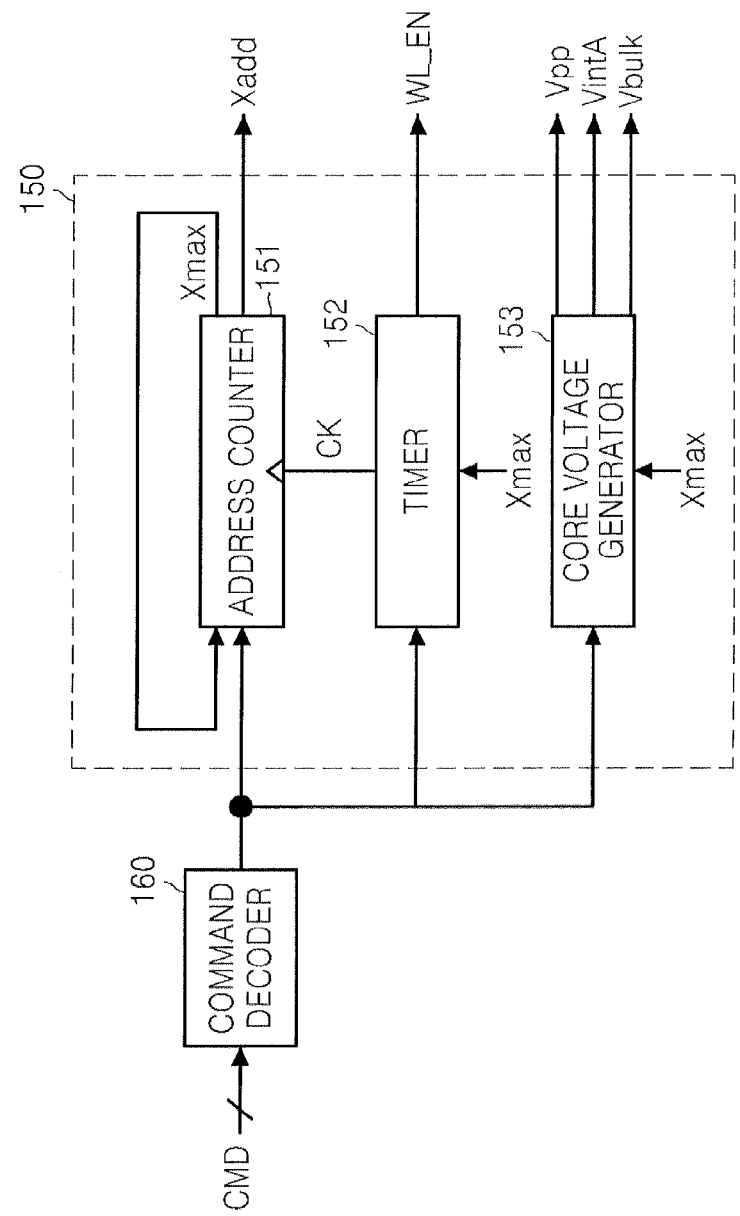
FIG. 2 is a block diagram of a self refresh control circuit of the memory device of FIG. 1.
Figure 3:
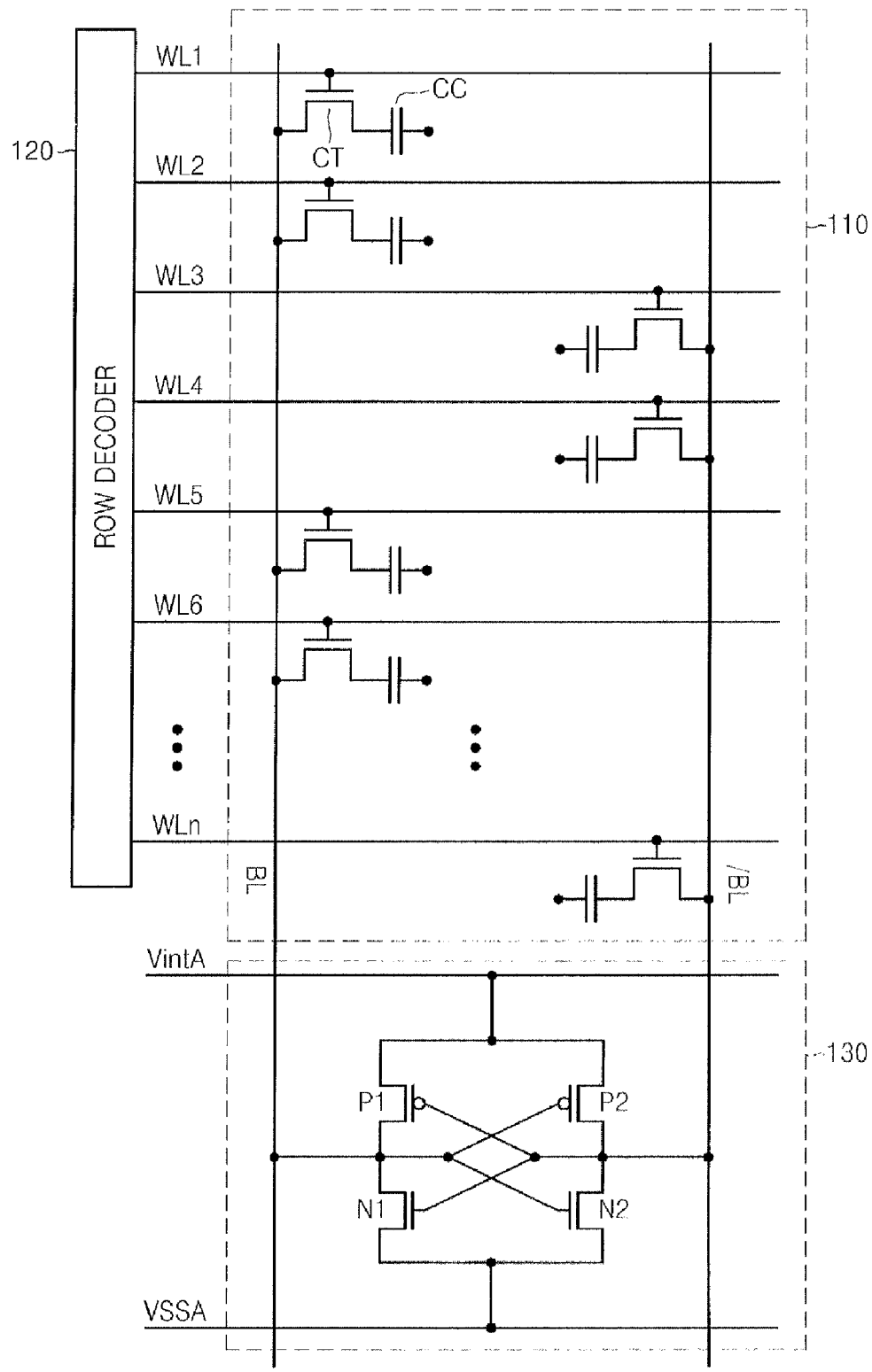
FIG. 3 is a circuit diagram of a memory cell array and a sense amplifier of the memory device of FIG. 1.
Figure 4A:
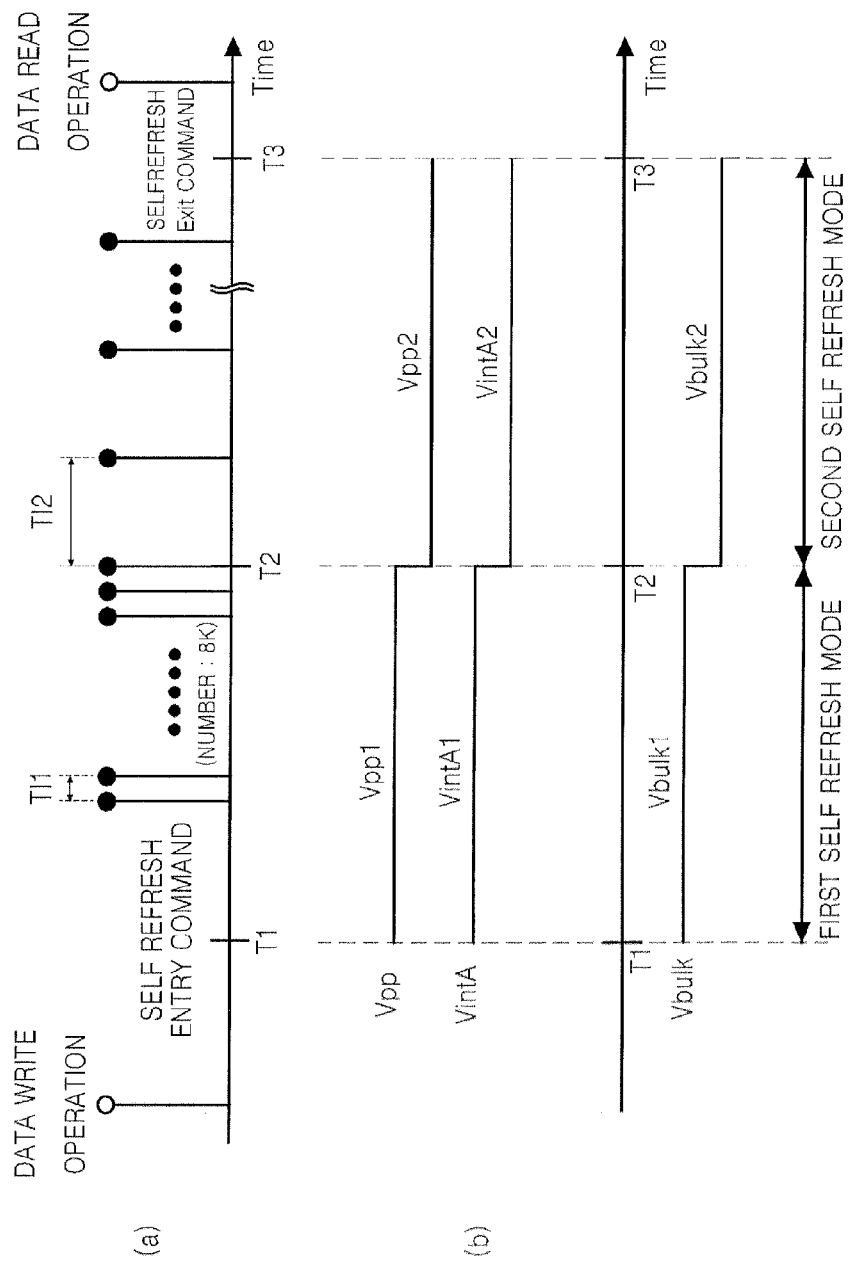
FIG. 4A illustrates first and second self refresh mode operations of a semiconductor memory device according to an exemplary embodiment of the present inventive concept.

FIG. 1 is a block diagram of a semiconductor memory device 100 according to an exemplary embodiment of the present inventive concept. FIG. 2 is a block diagram of a self refresh control circuit 150 of the semiconductor memory device 100 of FIG. 1. FIG. 3 is a circuit diagram of a memory cell array 110 and a sense amplifier 130 of the semiconductor memory device 100 of FIG. 1. FIGS. 4A and 4B illustrate a method of refreshing a semiconductor memory device according to an exemplary embodiment of the present inventive concept.

Referring to FIGS. 1-4B, the semiconductor memory device 100 includes the memory cell array 110, a row decoder 120, the sense amplifier 130, a column decoder 140, the self refresh control circuit 150, a command decoder 160, a mode register set/extended mode register set (MRS/EMRS) circuit 170, an address buffer 180, and a data input/output circuit 190. The operation of the semiconductor memory device 100 is schematically described below.

Referring to FIG. 3, the memory cell array 110 is a data storage place in which a lot of memory cells are arrayed in a row direction and a column direction. Each memory cell includes a cell capacitor CC and an access transistor CT. A gate of the access transistor CT may be connected to a corresponding one of a plurality of word lines WL1-WLn arranged in the row direction. One of a source and a drain of the access transistor CT may be connected to a bit line BL or a complementary bit line /BL arranged in the column direction. The other one of the source and the drain of the access transistor CT may be connected to a one end of the cell capacitor CT of which another end is connected to a potential.

The sense amplifier 130 senses and amplifies data on a memory cell and stores the data in the memory cell. The sense amplifier 130 may be implemented by a cross-coupled amplifier connected between the bit line BL and the complementary bit line /BL as illustrated in FIG. 3. The sense amplifier 130 of a cross-coupled amplifier type may include PMOS transistors P1 and P2 connected to a sense amplifier voltage VintA, the bit line BL, and the complementary bit line /BL, and NMOS transistors N1 and N2 connected to the bit line BL, the complementary bit line /BL, and an array power voltage VSSA.

Referring back to FIGS. 1-4A, data DQ input through the data input/output circuit 190 is written to the memory cell array 110 based on an address signal ADD. The data DQ read out from the memory cell array 110 based on the address signal ADD is output to an outside of the semiconductor memory device 100 through the data input/output circuit 190. To write data or designate a memory cell to be read, the address signal ADD is input to the address buffer 180. The address buffer 180 temporarily stores the address signal ADD input from an outside of the semiconductor memory device 100.

The row decoder 120 decodes a row address of the address signal ADD output from the address buffer 180 to designate a word line connected to the memory cell which data is to be input to or output from. That is, in a data write or read mode, the row decoder 120 decodes the row address output from the address buffer 180 and enables a corresponding word line. Also, in a self refresh mode, the row decoder 120 decodes the row address generated from an address counter 151 of the self refresh control circuit 150 of FIG. 2 and enables a corresponding word line.

The column decoder 140 decodes a column address of the address signal ADD output from the address buffer 180 to designate a bit line connected to a memory cell which data is to be input to or output from. The memory cell array 110 outputs data from or write data to the memory cell designated by the row and column addresses.

The command decoder 160 receives a signal such as a command signal CMD, for example, /CBR (CAS-before-RAS) or /CKE (clock enable signal), applied from an outside of the semiconductor memory device 100, and decodes the signals to internally generate a decoded command signal, for example, a self refresh entry command or a self refresh exit command. The MRS/EMRS circuit 170 sets an internal mode register in response to an MRS/EMRS command and the address signal ADD to designate the operation mode of the semiconductor memory device 100.

The MRS/EMRS command may be generated from a controller of the semiconductor memory device 100, or from an outside of the semiconductor memory device 100, such as a memory controller connected to the semiconductor memory device 100. The address signal ADD may include the MRS/EMRS command to set the refresh mode of the memory cells of the memory cell array 110.

Although it is not illustrated in FIG. 1, the semiconductor memory device 100 may further include a clock circuit (not illustrated) to generate a clock signal and a power circuit (not illustrated) to receive the externally applied power voltage and generate or distribute an internal voltage. The clock signal and internal voltage may be supplied to units of the semiconductor memory device 100 to perform writing/reading/refreshing operations thereof.

The self refresh control circuit 150 controls the self refresh operation of the semiconductor memory device 100 in response to the command output from the command decoder 160.

Referring to FIGS. 1 and 2, the self refresh control circuit 150 includes the address counter 151, a timer 152, and a core voltage generator 153. The address counter 151 generates a row address Xadd to designate a row address subject to self refresh and applies the generated row address to the row decoder 120, in response to the self refresh entry command output from the command decoder 160. The address counter 151 may terminate a counting operation in response to the self refresh exit command output from the command decoder 160.

The address counter 151 counts from a predetermined initial value (hereinafter, referred to as the start row address) and sequentially generates row addresses, in response to the clock signal CK. The counting may be up-counting or down-counting. When the row address reaches a predetermined final value (hereinafter, referred to as the final row address Xmax), the address counter 151 is initialized to the start row address and the counting is resumed from the start row address.

The timer 152 generates a word line enable signal WL_EN and the clock signal CK at every first self refresh cycle (TI1 of FIG. 4) in a first self refresh mode, and the word line enable signal WL_EN and the clock signal CK at every second self refresh cycle (TI2 of FIG. 4) in a second self refresh mode. The first self refresh cycle TI1 is shorter than the second self refresh cycle TI2. For example, the first self refresh cycle TI1 may be remarkably shorter than the second self refresh cycle TI2. For example, a ratio between the first self refresh cycle TI1 and the second self refresh cycle TI2 may be 1:10. However, the present general inventive concept is not limited thereto.

The timer 152 may operate the first self refresh mode in response to the self refresh entry command. That is, the timer 152 may generate the word line enable signal WL_EN and the clock signal CK at every first self refresh cycle TI1, in response to the self refresh entry command. Thus, in the first self refresh mode, a corresponding one of the word lines is enabled at every first self refresh cycle TI1 and thus a first refresh operation is performed on the corresponding memory cell of the enabled word line.

The timer 152 may operate the second self refresh mode in response to the final row address Xmax output from the address counter 151. That is, the timer 152 may generate the word line enable signal WL_EN and the clock signal CK at every second self refresh cycle TI2, in response to the final row address. The timer 152 may terminate the operation in response to the self refresh exit command. Thus, in the second self refresh mode, a corresponding one of the word lines is enabled at every second self refresh cycle TI2 and thus a second refresh operation is performed on the corresponding memory cell of the enabled word line.

The core voltage generator 153 generates core voltages to be applied to a memory core unit in the self refresh mode. The memory core unit may include the memory cell array 110 and the sense amplifier 130 of FIG. 2. The core voltages may include a word line voltage Vpp to be applied to a word line subject to the first and/or self refresh operations, a sense amplifier voltage VintA to be applied to the sense amplifier 130, and an array body voltage Vbulk to be applied to a body of the memory cell. The body of the memory cell may include a transistor and/or a capacitor.

The core voltage generator 153 may operate in the first self refresh mode in response to the self refresh entry command. That is, the core voltage generator 153 generates first core voltages in response to the self refresh entry command. The first core voltages may include a first word line voltage Vpp1, a first sense amplifier voltage VintA1, and a first array body voltage Vbulk1, which are illustrated in FIG. 4A.

The core voltage generator 153 may operate in the second self refresh mode in response to the final row address Xmax output from the address counter 151. That is, the core voltage generator 153 generates second core voltages in response to the final row address Xmax. The second core voltages may include a second word line voltage Vpp2, a second sense amplifier voltage VintA2, and a second array body voltage Vbulk2, which are illustrated in FIG. 4A.

The second word line voltage Vpp2, the second sense amplifier voltage VintA2, and the second array body voltage Vbulk2 of the second core voltage, are respectively lower than the first word line voltage Vpp1, the first sense amplifier voltage VintA1, and the first array body voltage Vbulk1 of the first core voltage. That is, the level of the first word line voltage Vpp1 is higher than that of corresponding one, that is, the second word line voltage Vpp2, among the second core voltages. The level of the first sense amplifier voltage VintA1 is higher than that of corresponding one, that is, the second sense amplifier voltage VintA2, among the second core voltages. The level of the first array body voltage Vbulk1 is higher than that of corresponding one, that is, the second array body voltage Vbulk2, among the second core voltages.

According to an embodiment of the present general inventive concept, the level of the second word line voltage Vpp2 may be higher than the level of the first sense amplifier voltage VintA1. However, the present general inventive concept is not limited thereto. It is possible that the level of the second word line voltage Vpp2 may not be higher than the level of the first sense amplifier voltage VintA1. And it is also possible that the level of the first word line voltage Vpp1 may be higher than the level of the first sense amplifier voltage VintA1.

The core voltage generator 153 may terminate the operation in response to the self refresh exit command. Referring FIG. 4A, the first and second self refresh mode operations according to the present exemplary embodiment is described as follows.

The self refresh entry command may be generated at a predetermined time point T1 after a data write operation is completed. The self refresh control circuit 150 operates in the first self refresh mode in response to the self refresh entry command. Accordingly, the row address subject to the self refresh is output by the address counter 151 at every first self refresh cycle TI1. As a word line corresponding to the output row address is enabled, the self refresh operation is performed. The first word line voltage Vpp1 is applied to the enabled word line. The first sense amplifier voltage VintA1 and the first array body voltage Vbulk1 are respectively applied to the sense amplifier 130 and the body, that is, a substrate, of the memory cell.

The self refresh operation is made of a series of sensing and amplifying data of memory cells connected to the enabled word line and storing the sensed and amplified data back to the corresponding memory cells.

In the first self refresh mode, since the self refresh cycle is relatively short and the voltage level applied to the memory core unit is relatively high, data of a weak cell may be firmly restored. The weak cell means a cell in which the amount of charges stored in the memory cell is not sufficient. For example, during a data write operation, a sufficient amount of charges may not be stored in the memory cell due to an insufficient data write time, insufficient voltage, etc. Since the data of the weak cell is lost when a refresh cycle is very long or the refresh operation is insufficient, reliability of data may be deteriorated.

Here, the weak cell indicates a memory cell with a very low voltage level which may not be enough to maintain data written in the memory cell. It is possible that a first memory cell has a first low voltage during storing first data and a second memory cell has a second low voltage during storing second data. The first low voltage is lower than the second low voltage. The first and second memory cells are refreshed with the first core voltages to reach a required voltage during the first refresh mode. If the first and second memory cells are refreshed with the second core voltages during the first refresh mode, it is possible that the first memory cell may not be refreshed to reach the required voltage to maintain data while the second memory cell may be refreshed to reach the required voltage to maintain data. According to the present general inventive concept, the first and second memory cells can be refreshed to reach the required voltage when the first cell has the first voltage lower than the second voltage of the second memory cell.

According to an exemplary embodiment of the present inventive concept, during a first self refresh cycle after the self refresh mode starts, the self refresh control circuit 150 operates in the first self refresh mode to make the self refresh cycle relatively shorter and increase the voltage of the memory core unit so that the data of the weak cell may be firmly restored. The self refresh cycle signifies a period during which all word lines subject to the self refresh are respectively refreshed once from a start word line to a final word line. The first self refresh cycle signifies a period during which all word lines subject to the first self refresh after the self refresh entry command is issued are respectively refreshed once from a start word line to a final word line.

Thus, after the data of the memory cell is firmly restored during the first self refresh cycle, the second self refresh mode is entered and thus the self refresh cycle is relatively prolonged, that is, the second refresh cycle is relatively longer than the first refresh cycle, and the voltage of the memory core unit is lowered, that is, the second core voltage is lower than the first core voltage, so that operation current and power consumption may be reduced. According to the exemplary embodiment of the present inventive concept, as the restoration capability of the cell data of the memory cell is improved during the first self refresh mode, the refresh time during the second self refresh that is subsequent relatively long data retention time may be guaranteed and secured.

In the second self refresh mode, the row address subject to the self refresh is output by the address counter 151 at every second self refresh cycle TI2. As a word line corresponding to the output row address is enabled, the self refresh operation is performed. The second word line voltage Vpp2 is applied to the enabled word line. The second sense amplifier voltage VintA2 and the second array body voltage Vbulk2 are respectively applied to the sense amplifier 130 and the body, for example, a substrate, of the memory cell.

When the first and second refresh cycles are respectively 100 ns and 10 us and the number of word lines subject to the self refresh is 8K, the first self refresh mode section may be about 800 us (=8K×100 ns×one time), and the second self refresh mode section may be about 8K×10 us×j times. Here, "j" is the number of the self refresh cycles performed after the second self refresh mode is entered until the self refresh exit command is applied, which may be several hundreds or thousands.

Thus, since the first self refresh mode section is very short compared to the second self refresh mode section, an effect on the power consumption is not much and the weak cell may be firmly restored.

FIG. 4B illustrates self refresh mode operations of a semiconductor memory device according to an exemplary embodiment of the present inventive concept.

Referring to FIGS. 1-4B, a self refresh entry command may be generated at a predetermined time point T1 after a data write operation is completed. The self refresh control circuit 150 operates in the first self refresh mode in response to the self refresh entry command. Accordingly, the row address subject to the self refresh is output by the address counter 151 at every first self refresh cycle (first rate) TI1 in a first period P1 between times T1A and T1B. As a word line corresponding to the output row address is enabled, the self refresh operation is performed. The first word line voltage Vpp1 is applied to the enabled word line. The first sense amplifier voltage VintA1 and the first array body voltage Vbulk1 are respectively applied to the sense amplifier 130 and the body, that is, a substrate, of the memory cell.

In a second self refresh mode at a predetermined time point T2, the row address subject to the self refresh is output by the address counter 151 at every second self refresh cycle (second rate) TI2 in a second period P2 between times T2A and T2B. As a word line corresponding to the output row address is enabled, the self refresh operation is performed. The second word line voltage Vpp2 is applied to the enabled word line. The second sense amplifier voltage VintA2 and the second array body voltage Vbulk2 are respectively applied to the sense amplifier 130 and the body, for example, a substrate, of the memory cell. The second self refresh mode is completed at a time point T3 according to a self refresh end command and then a write or read operation is performed according to the sequentially input command.

Another self refresh entry command may be generated at a predetermined time point T4 after completion of the read or write operation according to a read or write command to control the memory cells to read or write data. The self refresh control circuit 150 operates in a third self refresh mode in response to the self refresh entry command. Accordingly, the row address subject to the self refresh is output by the address counter 151 at every third self refresh cycle (third rate) TI4 in a third period P4 between times T4A and T4B. As a word line corresponding to the output row address is enabled, the self refresh operation is performed. The third word line voltage Vpp3 is applied to the enabled word line. The third sense amplifier voltage VintA3 and the third array body voltage Vbulk3 are respectively applied to the sense amplifier 130 and the body, that is, a substrate, of the memory cell.

In a fourth self refresh mode at a predetermined time point T5, the row address subject to the self refresh is output by the address counter 151 at every fourth self refresh cycle (fourth rate) TI5 in a fourth period P5 between times T5A and T5B. As a word line corresponding to the output row address is enabled, the self refresh operation is performed. The fourth word line voltage Vpp4 is applied to the enabled word line. The fourth sense amplifier voltage VintA4 and the fourth array body voltage Vbulk4 are respectively applied to the sense amplifier 130 and the body, for example, a substrate, of the memory cell. The fourth self refresh mode is completed at a time point T6 according to a self refresh end command and then a write or read operation is performed according to the sequentially input command It is possible that the first self refresh cycle (first rate) TI1 and the first period P1 are same as the third self refresh cycle (third rate) TI4 and the third period P4, respectively, and the second self refresh cycle (second rate) TI2 and the second period P2 are same as the fourth self refresh cycle (fourth rate) TI5 and the fourth period P5, respectively. However, the present general inventive concept is not limited thereto.

Here, it is possible that the third self refresh cycle (third rate) TI4 can be shorter than the fourth self refresh cycle (fourth rate) TI5 and that the third period P4 can be shorter than the fourth period P5.

It is also possible that each of the voltages may be variable or determined according to at least one of the corresponding rates and periods of the respective modes. The rates and periods may also be variable or determined according the corresponding voltages.

Figure 5:
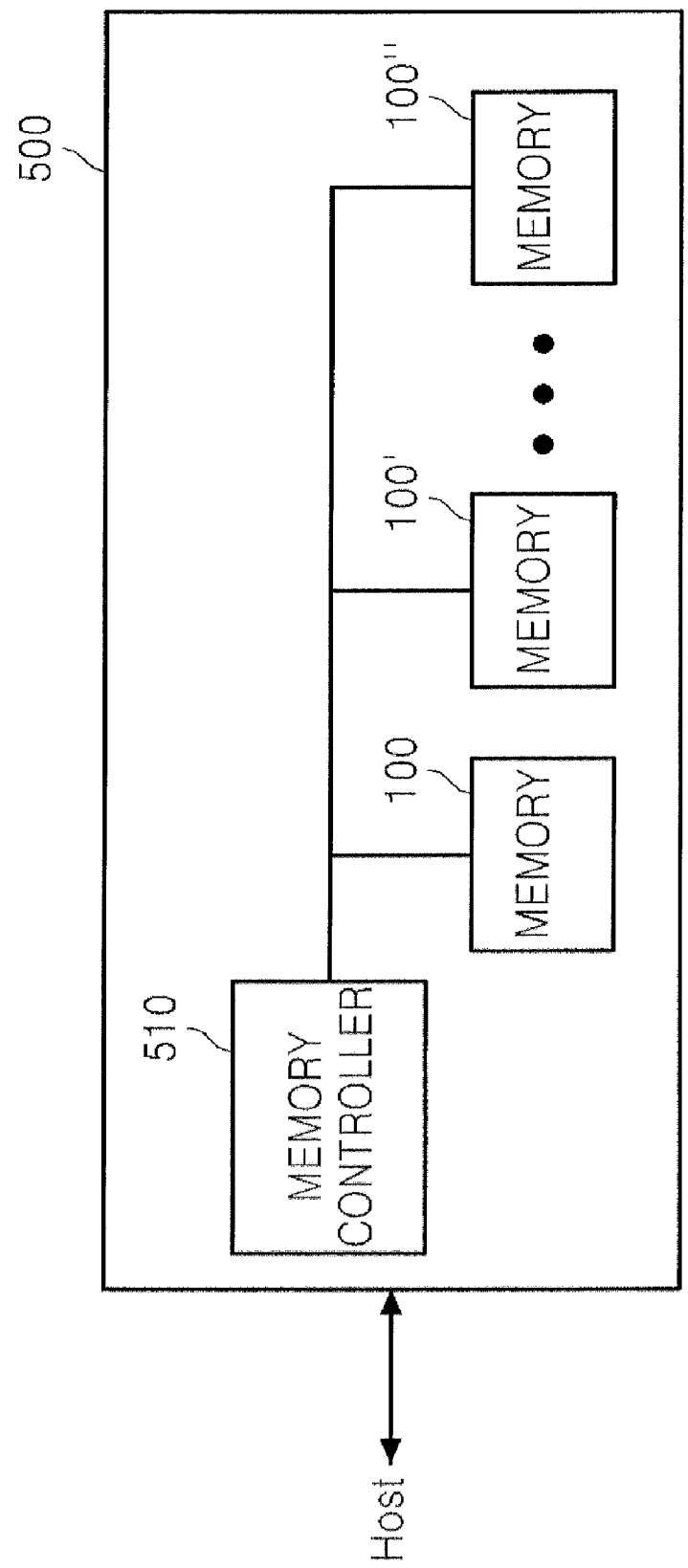
FIG. 5 is a block diagram of a memory system according to an exemplary embodiment of the present inventive concept.

FIG. 5 is a block diagram of a memory system 500 according to an exemplary embodiment of the present inventive concept.

The memory system 500 having at least one semiconductor memory devices 100, 100', ..., 100" and a memory controller 510 controlling the semiconductor memory devices 100, 100', ..., 100". The structure and the operation of the semiconductor memory devices 100, 100', ..., 100" have been described in detail with reference to the semiconductor memory device 100.

The non-volatile memory device 100 and/or the memory controller 510 according to some embodiments of the present inventive concept may be packed in various types of packages. For example, the various packages may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

The memory device 100 and the memory controller 510 may form a memory card. At this time, the memory controller 510 may be designed to communicate with an external device, e.g., a host, using one of various interface protocols such as universal serial bus (USB), multi-media card (MMC), a peripheral component interconnect express (PCI-E), serial ATA (SATA), parallel ATA (PATA), small computer system interface (SCSI), enhanced small disk interface (ESDI), and integrated drive electronics (IDE).

Figure 6:
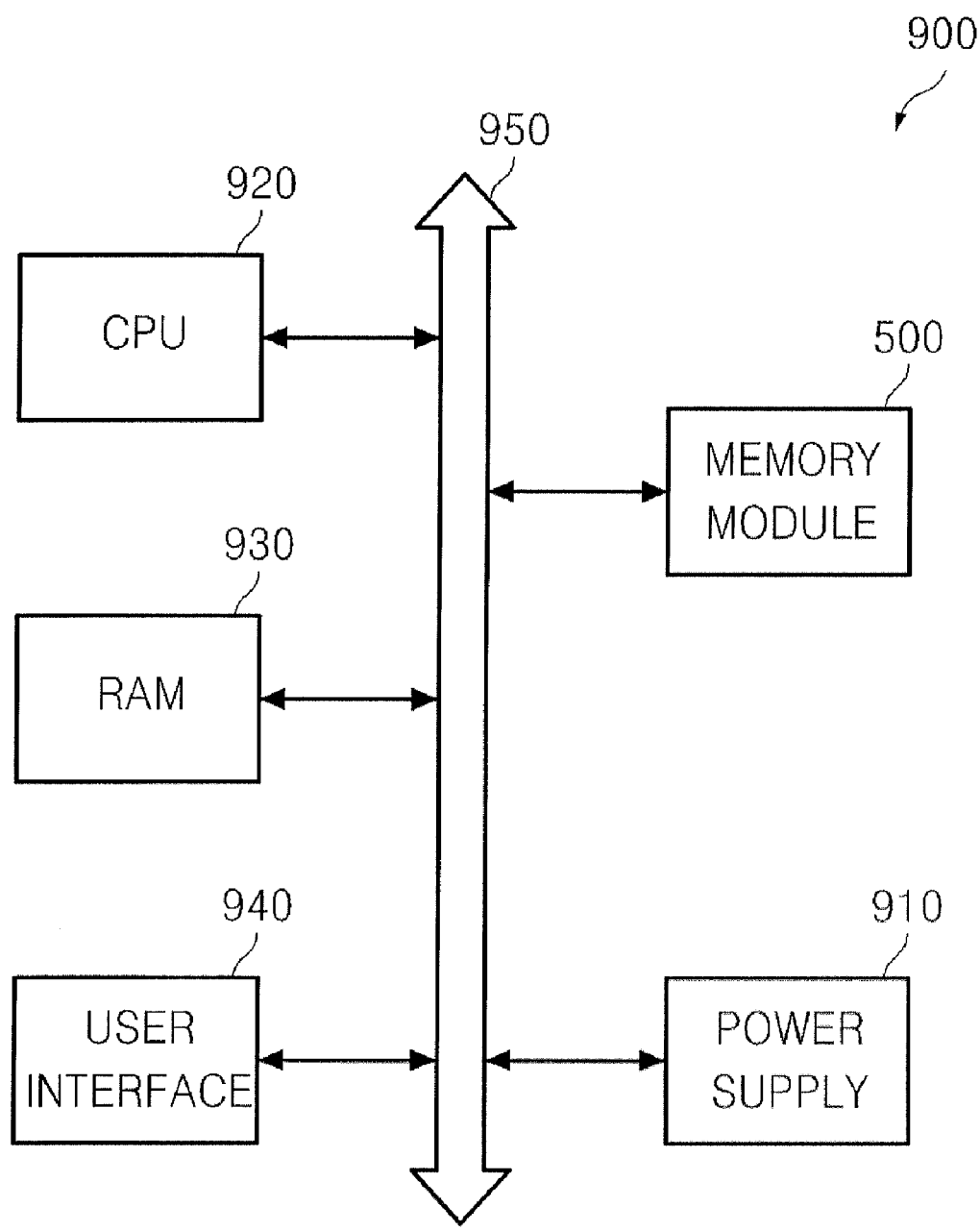
FIG. 6 is a block diagram of an electronic system according to an exemplary embodiment of the present inventive concept.

The memory device 100 or the memory system 500 according to the present exemplary embodiment may be installed at a electronic system, for example, systems such as mobile devices or desktop computers, of which an example is illustrated in FIG. 6.

Referring to FIG. 6, the electronic system 900 having the memory system 500, a power supply 910, a CPU 920, a RAM 930, a user interface 940, which are electrically connected is a system bus 950.

The CPU 920 controls the overall operation of the system 900. The RAM 930 stores information needed for the operation of the system 900. The user interface 940 provides interface between the system 900 and a user. The power supply 910 provides power to the internal constituent elements such as the CPU 920, the RAM 930, the user interface 940, and the nonvolatile memory system 500.

The electronic system 900 may further include a function unit to perform its own function according to a control signal of the CPU 920. The function unit may receive the power from the power supply 910 and communicate with the internal constituent elements such as the CPU 920, the RAM 930, the user interface 940, and the nonvolatile memory system 500. For example, the function unit may be a function to process data read from the memory device or data to be written in the memory device. The Function unit may be an image or audio processing unit to process data of the memory device to generate an image according to the processed data or to generate data representing an image or sound received from an outside thereof and then to be written in the memory device, or an image or audio forming unit, a mobile transmission unit, or a communication unit to communicate with an external device.

Although it is not illustrated in the drawings, the electronic system 900 may be further provided with application chipsets, camera image processors (CISs), or mobile DRAMs, which is well known to one skilled in the art to which the present inventive concept pertains.

As described above, according to the present inventive concept, the data of a weak cell may be firmly restored through the self refresh. Thus, reliability of a memory device and a system having the memory device may be improved.

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains Although a few embodiments of the present general invention concept have been shown and described, it would be appreciated by those skilled in the art that changes may be made in these embodiments without departing from the principles and spirit of the general inventive concept, the scope of which is defined in the claims and their equivalents.

What is claimed is:

1. A semiconductor memory device comprising:
    a memory core unit comprising a memory cell array including a plurality of memory cells and a sense amplifier to sense and amplify data of the plurality of memory cells; and
    a self refresh control unit to apply at least one first core voltage to the memory core unit and to control a self refresh operation to be performed at every first self refresh cycle, in a first self refresh mode, and to apply at least one second core voltage to the memory core unit and to control the self refresh operation to be performed at every second self refresh cycle, in a second self refresh mode,
    wherein a level of the at least one first core voltage is higher than that of a corresponding one of the at least one second core voltage, and the first self refresh cycle is shorter than the second self refresh cycle.

2. The semiconductor memory device of claim 1, wherein the self refresh control unit operates in the first self refresh mode in response to a self refresh entry command, and in the second self refresh mode after refreshing each of a plurality of word lines subject to refresh only once in the first self refresh mode.

3. The semiconductor memory device of claim 1, wherein the self refresh control unit comprises:
    a timer to generate a word line enable signal and a clock signal at every first self refresh cycle based on a self refresh entry command;
    an address counter to sequentially generate a plurality of row addresses to designate the plurality of word lines subject to self refresh in response to the clock signal; and
    a core voltage generator to generate the core voltage of a first level based on the self refresh entry command.

4. The semiconductor memory device of claim 3, wherein:
    the address counter sequentially generates the plurality of row addresses by counting from a start row address to a final row address, and starting counting again from the start row address when the final row address is reached;
    the timer generates the word line enable signal and the clock signal at every second self refresh cycle in response to the final row address; and
    the core voltage generator generates the at least one second core voltage in response to the final row address.

5. The semiconductor memory device of claim 4, wherein:
    the at least one first core voltage comprises:
    a first word line voltage applied to the word line subject to self refresh,
    a first sense amplifier voltage applied to the sense amplifier, and
    a first array body voltage applied to a body of the memory cell;
    the at least one second core voltage comprises:
    a second word line voltage applied to the word line subject to self refresh;
    a second sense amplifier voltage applied to the sense amplifier, and
    a second array body voltage applied to the body of the memory cell; and
    the second word line voltage, the second sense amplifier voltage, and the second array body voltage are respectively lower than the first word line voltage, the first sense amplifier voltage, and the first array body voltage.

6. The semiconductor memory device of claim 4, wherein the first self refresh mode is performed until a first final row address output from the address counter is generated after the self refresh entry command is applied, and in the second self refresh mode until a self refresh exit command is applied after the first final row address is generated.

7. The semiconductor memory device of claim 1, wherein the first self refresh cycle is not greater than one tenth (1/10) of the second self refresh cycle.

8. A memory system comprising the semiconductor memory device of claim 1.

9. The memory system of claim 8, further comprising a memory controller to control the semiconductor memory device.

10. An apparatus comprising:
    a semiconductor memory device comprising:
    a memory cell array including a plurality of memory cells to store data, and
        a self refresh control unit to control the memory cell array to perform a refresh operation, and to generate a first core voltage at a first self refresh cycle in a first self refresh mode and a second core voltage at a second self refresh cycle in a second self refresh mode in the refresh operation; and
        a controller to generate a control signal to control the self refresh control unit of the semiconductor memory device to perform the refresh operation
    wherein a level of the first core voltage is higher than that of the second core voltage, and the first self refresh cycle is shorter than the second self refresh cycle.

* * * * *

UNITED STATES PATENT AND TRADEMARK OFFICE
CERTIFICATE OF CORRECTION

PATENT NO. : 8,144,539 B2
APPLICATION NO. : 12/645962
DATED : March 27, 2012
INVENTOR(S) : Jong Hyoung Lim et al.

It is certified that error appears in the above-identified patent and that said Letters Patent is hereby corrected as shown below:

Title Page, below Item (22), insert

Section --(30) Foreign Application Priority Data
December 26, 2008 (KR)...... 10-2008-0134019--

Signed and Sealed this
Third Day of July, 2012

David J. Kappos
*Director of the United States Patent and Trademark Office*